(12) United States Patent
Higashi et al.

(10) Patent No.: US 10,164,526 B2
(45) Date of Patent: Dec. 25, 2018

(54) SIGNAL GENERATION CIRCUIT, VOLTAGE CONVERSION DEVICE, AND COMPUTER PROGRAM

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Makoto Higashi, Mie (JP); Takenori Abe, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/767,418

(22) PCT Filed: Oct. 24, 2016

(86) PCT No.: PCT/JP2016/081381
§ 371 (c)(1),
(2) Date: Apr. 11, 2018

(87) PCT Pub. No.: WO2017/073497
PCT Pub. Date: May 4, 2017

(65) Prior Publication Data
US 2018/0309365 A1    Oct. 25, 2018

(30) Foreign Application Priority Data
Oct. 29, 2015    (JP) .................................. 2015-213414

(51) Int. Cl.
*G05F 1/565* (2006.01)
*H02M 3/157* (2006.01)
(Continued)

(52) U.S. Cl.
CPC ........... *H02M 3/157* (2013.01); *H02M 1/088* (2013.01); *H02M 3/1588* (2013.01)

(58) Field of Classification Search
CPC ...... H02M 3/157; H02M 3/1584; G05F 1/565
(Continued)

(56) References Cited

U.S. PATENT DOCUMENTS 5,886,513 A    3/1999    Appeltans et al.
2006/0158412 A1*    7/2006    Morita ................. G09G 3/3655
345/94

(Continued)

FOREIGN PATENT DOCUMENTS

JP    H03-098470 A    4/1991
JP    2000-511758 A    9/2000
(Continued)

OTHER PUBLICATIONS

Search Report for PCT/JP2016/081381, dated Jan. 17, 2017.

*Primary Examiner* — Adolf Berhane
*Assistant Examiner* — Nusrat Quddus
(74) *Attorney, Agent, or Firm* — Honigman Miller Schwartz and Cohn LLP

(57) ABSTRACT

A signal generation circuit, a voltage conversion device, and a computer program are provided wherein the minimum increment of a value to be set for a generating portion, can be made substantially smaller than an actual increment with a relatively small processing load. A CPU specifies a set value Y (closest to a target value X) and a second closest set value Z in every N periods of a first signal, determines N set values for the first signal by combining Y and Z based on the
(Continued)

result of comparison between the values of Y and Z and the value of X, sets one set value for a generating portion for each period of the first signal, calculates a value for setting off-time of the second signal in a first period in N periods as an additional value, and sets the calculated value for the generating portion.

10 Claims, 13 Drawing Sheets

(51) Int. Cl.
  *H02M 1/088* (2006.01)
  *H02M 3/158* (2006.01)
(58) Field of Classification Search
  USPC .......................................... 323/271–289, 315
  See application file for complete search history.

(56) References Cited

U.S. PATENT DOCUMENTS

| | | | |
|---|---|---|---|
| 2007/0296387 A1* | 12/2007 | Dong | .................... H02M 3/157 323/285 |
| 2009/0185468 A1* | 7/2009 | Sakai | .................... G11B 7/0906 369/53.35 |
| 2011/0096193 A1* | 4/2011 | Egawa | .................... H04N 5/235 348/226.1 |
| 2012/0161741 A1* | 6/2012 | Zambetti | ................. G05F 3/245 323/294 |
| 2014/0067233 A1* | 3/2014 | Nishida | .................... F02D 41/20 701/103 |
| 2014/0253257 A1 | 9/2014 | Emoto et al. | |
| 2015/0028774 A1* | 1/2015 | Konishi | ............... H05B 33/089 315/302 |
| 2018/0034449 A1* | 2/2018 | Hasegawa | ............. H02M 3/157 |
| 2018/0062372 A1* | 3/2018 | Lee | .................... G01R 31/1272 |
| 2018/0066597 A1* | 3/2018 | Fukuzumi | ............... F02D 41/20 |
| 2018/0248465 A1* | 8/2018 | Higashi | .................... H02M 1/08 |

FOREIGN PATENT DOCUMENTS

| | | |
|---|---|---|
| JP | 2004-312913 A | 11/2004 |
| JP | 2013-090002 A | 5/2013 |

* cited by examiner

FIG 9

| target value | N set values | | | | average values of N set values | average value of on time |
|---|---|---|---|---|---|---|
| | First set value | second set value | third set value | Fourth set values | | |
| 0.00~0.12 | 0 | 0 | 0 | 0 | 0.00 | 0.000 |
| 0.13~0.16 | 0 | 0 | 0 | 1 | 0.25 | 0.0025 |
| 0.17~0.25 | 0 | 0 | 1 | 0 | 0.25 | 0.0025 |
| 0.26~0.37 | 0 | 1 | 0 | 0 | 0.25 | 0.0025 |
| 0.38~0.50 | 0 | 1 | 0 | 1 | 0.50 | 0.005 |
| 0.51~0.62 | 1 | 0 | 1 | 0 | 0.50 | 0.005 |
| 0.63~0.75 | 1 | 0 | 1 | 1 | 0.75 | 0.0075 |
| 0.76~0.83 | 1 | 1 | 0 | 1 | 0.75 | 0.0075 |
| 0.84~0.87 | 1 | 1 | 1 | 0 | 0.75 | 0.0075 |
| 0.88~1.12 | 1 | 1 | 1 | 1 | 1.00 | 0.010 |
| ⋮ | ⋮ | ⋮ | ⋮ | ⋮ | ⋮ | ⋮ |
| 498.88~499.12 | 499 | 499 | 499 | 499 | 499.00 | 4.990 |
| 499.13~499.16 | 499 | 499 | 499 | 500 | 499.25 | 4.9925 |
| 499.17~499.25 | 499 | 499 | 500 | 499 | 499.25 | 4.9925 |
| 499.26~499.37 | 499 | 500 | 499 | 499 | 499.25 | 4.9925 |
| 499.38~499.50 | 499 | 500 | 499 | 500 | 499.50 | 4.995 |
| ⋮ | ⋮ | ⋮ | ⋮ | ⋮ | ⋮ | ⋮ |

FIG 12

| Target value | N set values | | | |
|---|---|---|---|---|
| | First set value | second set value | third set value | Fourth set values |
| 0.00~0.12 | 0 | 0 | 0 | 0 |
| 0.13~0.37 | 0 | 0 | 0 | 1 |
| 0.38~0.62 | 0 | 1 | 0 | 1 |
| 0.63~0.87 | 1 | 0 | 1 | 1 |
| 0.88~1.12 | 1 | 1 | 1 | 1 |
| 1.13~1.37 | 1 | 1 | 1 | 2 |
| 1.38~1.62 | 1 | 2 | 1 | 2 |
| ⋮ | ⋮ | ⋮ | ⋮ | ⋮ |
| 499.13~499.37 | 499 | 499 | 499 | 500 |
| 499.38~499.62 | 499 | 500 | 499 | 500 |
| ⋮ | ⋮ | ⋮ | ⋮ | ⋮ |

SIGNAL GENERATION CIRCUIT, VOLTAGE CONVERSION DEVICE, AND COMPUTER PROGRAM

CROSS-REFERENCE TO RELATED APPLICATIONS

This application is the U.S. national stage of PCT/JP2016/081381 filed Oct. 24, 2016, which claims priority of Japanese Patent Application No. JP 2015-213414 filed Oct. 29, 2015.

TECHNICAL FIELD

The present invention relates to a signal generation circuit that includes a generating portion for periodically generating a first signal having an on-time corresponding to a set value, and a second signal having an on-period that does not overlap an on-period of the first signal, and a control portion for setting a value that can be set for the generating portion in accordance with a target value, and also relates to a voltage conversion device, and a computer program.

BACKGROUND

Conventionally, voltage conversion devices for converting a voltage by driving a switching element using a PWM signal are widely used. For example, a voltage conversion device using this PWM control method calculates a voltage command value based on a target voltage value, and sets a value that corresponds to the calculated voltage command value for a PWM signal generating portion, thereby generating a PWM signal having a duty ratio that corresponds to the set value. By thus changing the duty ratio of the PWM signal for driving the switching element in accordance with the target voltage value, an output voltage that corresponds to the target voltage value is obtained.

In the case where switching elements that are driven by the PWM signal are bridge-connected, or in the case of synchronously rectifying a current that returns to a circuit having inductance in association with switching, a so-called dead time is provided from when one switching element turns off until the other switching element turns on so that two switching elements that are connected in series do not simultaneously turn on at any time.

Here, if a minimum increment (i.e. minimum unit) of a value that can be set for a PWM signal generating portion (hereinafter, "settable value") is relatively large, the duty ratio of the PWM signal cannot be smoothly varied with respect to a change in the target value, and the output voltage will vary step-wise. For example, in the case where a target value that is to be set for the PWM signal generating portion is calculated as an amount of operation to be made under PWM control, when the minimum increment of the settable value is greater than the minimum increment of the target value, the duty ratio of the PWM signal cannot be smoothly varied with respect to a change in the target value and a load change, and an error occurs in the output voltage.

In this regard, JP H3-98470A discloses a PWM inverter in which, when the on/off-time of a PWM signal is computed in every PWM control period, the on/off-time is calculated by performing computation while rounding down the remainder of division using a voltage command value as a dividend, and a PWM pulse is output based on the calculation result. The remainder that occurs in the above computation corresponds to a voltage command value that is not reflected in the on/off-time and rounded down.

In this PWM inverter, the remainder that has been rounded down is sequentially added to the voltage command value in the computation in the next and subsequent periods. Thus, the remainder that was not reflected in the on/off-time in the previous computation is reflected in the new on/off-time at the time of the next computation, the remainder at this time is further reflected in the next computation, and this computation is repeated. As a result, the average value of the on/off-time that is to be set for the PWM generating portion can be brought close to a target on/off-time that is to be originally set. That is to say, the minimum increment of the value set for the generating portion can be set smaller than the actual increment in average.

However, with the technique disclosed in JP H3-98470A, computation that includes division is executed in every PWM control period to determine the on/off-time of the PWM signal, and accordingly, a significant processing load occurs in every period. In addition, in JP H3-98470A, consideration is not given to the aforementioned dead time. For this reason, to secure a certain dead time, the on-time of PWM signals for at least two switching elements included in an inverter needs to be separately calculated. Therefore, with a cheap microcomputer with poor processing capability, there is a concern that the aforementioned computation processing and other processing, such as communication, cannot be stably executed in parallel, even if a change in the target value is relatively small.

The present invention has been made in view of the foregoing situation, and aims to provide a signal generation circuit in which a minimum increment of a value to be set for a generating portion, which periodically generates a first signal having an on-time corresponding to a set value, and a second signal having an on-period that does not overlap the on-period of the first signal, can be made substantially smaller than an actual increment with a relatively small processing load, as well as a voltage conversion device and a computer program.

SUMMARY

A signal generation circuit according to an aspect of the present invention includes: a generating portion for periodically generating a first signal having an on-time corresponding to a set value, and a second signal having an on-period that does not overlap an on-period of the first signal; and a control portion for setting a settable value that can be set for the generating portion in accordance with a target value for every period of the first signal, the generating portion generating the first and second signals for an external voltage conversion circuit, and causing a voltage to be converted by performing PWM control on the voltage conversion circuit, wherein the generating portion can set off-time of the second signal with the same accuracy as accuracy of the on-time of the first signal, and the control portion includes: a specifying portion for specifying a settable value that is closest to the target value and a second closest settable value in every N periods (N is a natural number that is 2 or greater) of the first signal; a determining portion for determining N settable values that are obtained by combining two settable values specified by the specifying portion, based on values of the two settable values and the target value; and a setting portion for setting, for the generating portion, the off-time of the second signal in a first period in the N periods, using an additional value obtained by adding a smaller one of the settable values determined by the determining portion to a predetermined value.

In a signal generation circuit according to an aspect of the present invention, the predetermined value is a value that is greater, by a minimum unit of the settable values, than a value for setting the off-time of the second signal to time in which both the first and second signals are to be OFF.

In a signal generation circuit according to an aspect of the present invention, the determining portion determines the N settable values so that an average value of M (M is a natural value that satisfies $2 \leq M \leq N$) is closest to the target value.

In a signal generation circuit according to an aspect of the present invention, the determining portion determines the N settable values so that an average value of the settable values is closest to the target value.

A signal generation circuit according to an aspect of the present invention may further include a storing portion for storing a correspondence relationship between the target value and the N settable values, wherein the storing portion stores the N settable values that have been determined in advance so that an average value of the settable values is closest to a corresponding target value, and the controller reads out the N settable values corresponding to the target value from the storing portion, and sets the read N settable values for the generating portion.

A voltage conversion device according to an aspect of the present invention includes: the above-described signal generation circuit; a voltage conversion circuit for converting a voltage by switching in accordance with a duty ratio of the first signal generated by the signal generation circuit; and a detecting portion for detecting the voltage that has been converted by the voltage conversion circuit, wherein the control portion included in the signal generation circuit includes a calculating portion for calculating the target value based on the voltage that has been detected by the detecting portion.

A computer program according to an aspect of the present invention is a computer program that can be executed by a control portion included in a signal generation circuit including: a generating portion for periodically generating a first signal having an on-time corresponding to a set value, and a second signal having an on-period that does not overlap an on-period of the first signal; and a control portion for setting a settable value that can be set for the generating portion in accordance with a target value for every period of the first signal, the generating portion generating the first and second signals for an external voltage conversion circuit, and causing a voltage to be converted by performing PWM control on the voltage conversion circuit, the computer program causing the control portion to function as: a specifying portion for specifying a settable value that is closest to the target value and a second closest settable value in every N periods (N is a natural number that is 2 or greater) of the first signal; a determining portion for determining N settable values that are obtained by combining two settable values specified by the specifying portion, based on values of the two settable values and the target value; and a setting portion for setting, for the generating portion, the off-time of the second signal in a first period in the N periods, using an additional value obtained by adding a smaller one of the settable values determined by the determining portion to a predetermined value.

In these aspects, the control portion determines and sets a settable value that can be set for the generating portion in accordance with the target value, and the generating portion periodically generates the first signal having the on-time corresponding to the set settable value, and the second signal having an on-period that does not overlap the on-period of the first signal. Specifically, the control portion specifies a settable value that is closest to the target value and a second closest settable value in every N periods of the first signal generated by the generating portion, determines N settable values by combining the specified two settable values based on the result of comparison between the values of the two specified settable values and the value of the target value, and sets one set value for the generating portion in each period of the first signal. The control portion also calculates the value for setting the off-time of the second signal in the first period in the N periods as an additional value obtained by adding the smaller one of the settable values determined for the same N periods to a predetermined value, and sets the calculated value for the generating portion.

Thus, regarding the N settable values determined by the control portion, the proportion between the settable value that is closest to the target value and the second closest settable value is appropriately determined. Accordingly, the average value of the N settable values is adjusted more finely than the smallest increment of the settable value. Furthermore, since the off-time of the second signal need only be set once in the N periods, a processing load on the control portion is reduced.

In these aspects, the aforementioned predetermined value is a value that is greater, by a minimum unit of the settable values of the first signal, than a value for setting the off-time of the second signal to a time in which both the first and second signals are to be off.

Thus, even if the on-time of the first signal has varied during the N periods, the dead time for the first signal and the second signal is secured.

In these aspects, the control portion determines the settable value that is closest to the target value as a first settable value, and repeats determining an $M^{th}$ settable value N−1 times so that the average value of the first to $M(2 \leq M \leq N)^{th}$ settable values is closest to the target value.

Thus, in any of the period in the N periods of a signal, the average value of the settable values that have been set for the generating portion from the first period to that period becomes closest to the target value.

In these aspects, the control portion determines N settables so that the average value of all of the N settable values is closest to the target value.

Thus, the average value of the N settable values that have been set for the generating portion over the entire N periods of a signal becomes closest to the target value.

In these aspects, the correspondence relationship between the target value and the N settable values that have been determined in advance so that the average value thereof is closest to the target value is stored in the storing portion. The control portion reads out N settable values that are to be set for the generating portion in correspondence with the target value from the storing portion.

Thus, the N settable values that are to be determined in accordance with the target value are read out from the storing portion when control is executed by the control portion, and are sequentially set for the generating portion over the N periods.

In these aspects, the voltage conversion circuit converts a voltage by switching in accordance with the duty ratio of the first signal generated by the above-described signal generation circuit, and the control portion in the signal generation circuit calculates a target value that is to be set for the generating portion based on the converted voltage.

Thus, the signal generation circuit, in which the minimum increment of the value that is to be set for the generating portion for periodically generating signals can be made substantially smaller than the actual increment with a relatively small processing load, is applied to the voltage conversion device, and the accuracy of the output voltage increases.

Advantageous Effects of Invention

According to the above, regarding the N settable values determined by the control portion, the proportion between the settable value that is closest to the target value and the second closest settable value is appropriately determined. Accordingly, the average value of the N settable values is adjusted more finely than the smallest increment of the settable value. Furthermore, since the off-time of the second signal need only be set once in the N periods, a processing load on the control portion is reduced.

Accordingly, the minimum increment of a value to be set for the generating portion, which periodically generates the first signal having the on-time corresponding to the set value, and the second signal having the on-period that does not overlap the on-period of the first signal, can be made substantially smaller than the actual increment with a relatively small processing load.

BRIEF DESCRIPTION OF DRAWINGS

FIG. 9 is a table showing a list of N set values that are determined in accordance with target values in the signal generation circuit according to Embodiment 1 of the present invention.

FIG. 12 is a table showing a list of N set values that are determined in accordance with target values in the signal generation circuit according to Embodiment 2 of the present invention.

DETAILED DESCRIPTION OF PREFERRED EMBODIMENTS

Hereinafter, the present invention will be described in detail based on the drawings showing the embodiments of the present invention.

Embodiment 1

Figure 1:
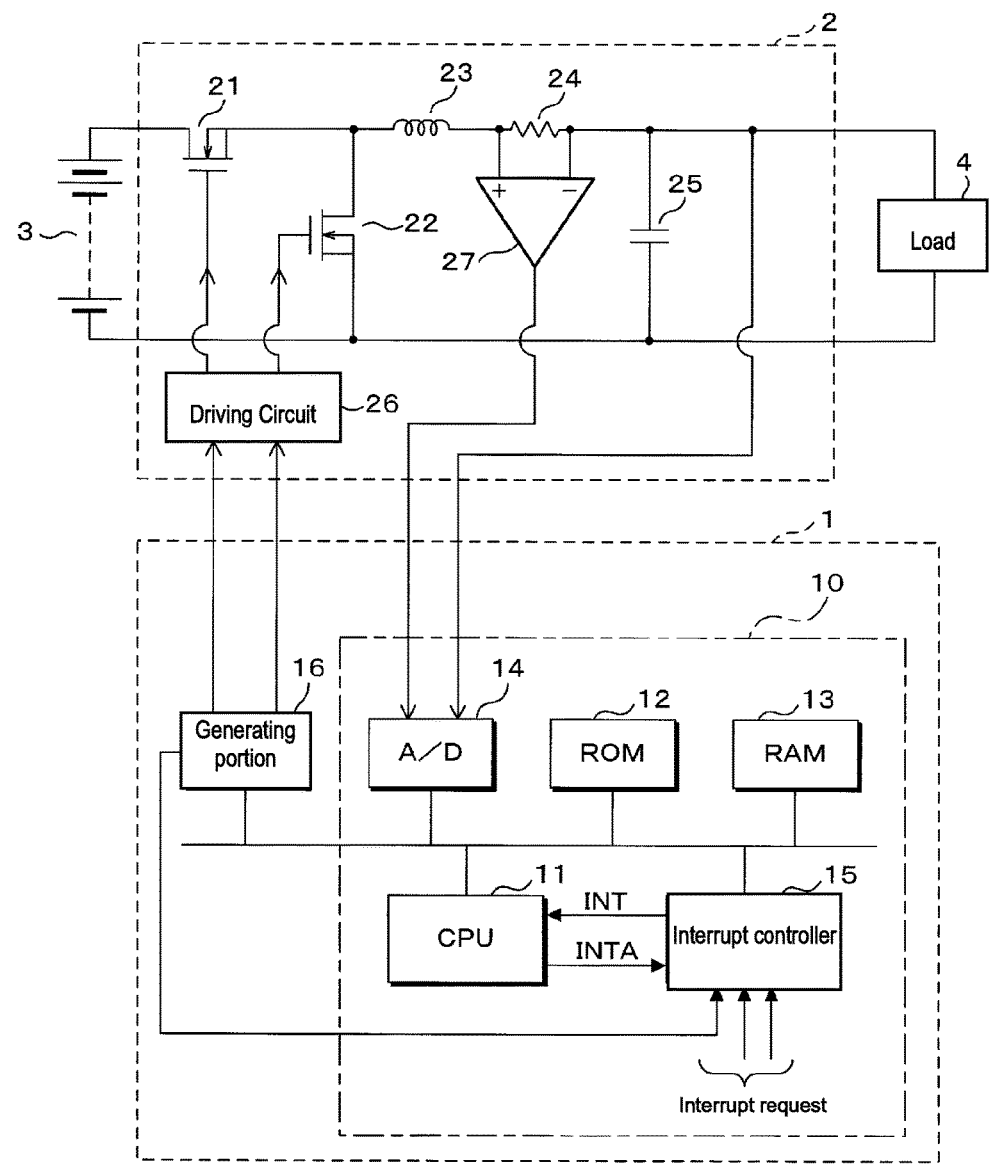
FIG. 1 is a block diagram showing an exemplary configuration of a voltage conversion device according to Embodiment 1 of the present invention.
Figure 2:
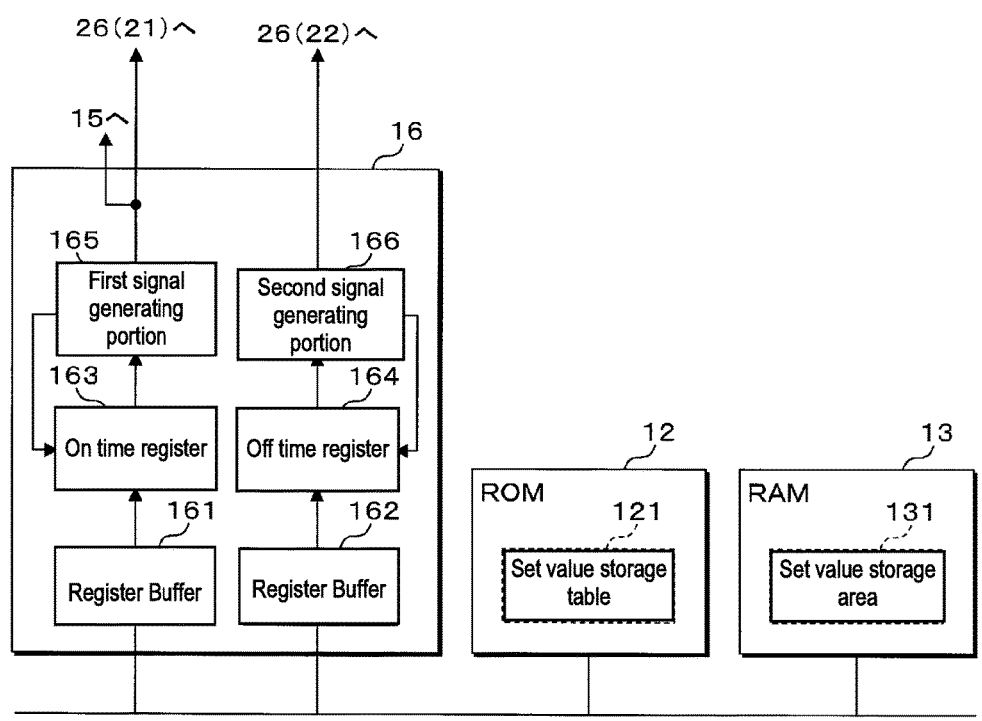
FIG. 2 is a block diagram showing an exemplary configuration of part of a signal generation circuit according to Embodiment 1 of the present invention.

FIG. 1 is a block diagram showing an exemplary configuration of a voltage conversion device according to Embodiment 1 of the present invention. FIG. 2 is a block diagram showing an exemplary configuration of part of a signal generation circuit according to Embodiment 1 of the present invention. In the drawings, 1 denotes a signal generation circuit. The signal generation circuit 1 generates two PWM signals each having a fixed period in which an on-time and an off-time change individually, and gives the generated two PWM signals to a voltage conversion circuit 2. The voltage conversion circuit 2 converts a voltage of an external battery 3 and supplies the converted voltage to an external load 4. Although the voltage conversion circuit 2 drops the voltage of the battery 3 here, the voltage conversion circuit 2 may also boost or boost and drop the voltage of the battery 3.

The signal generation circuit 1 is a microcomputer having a CPU (Central Processing Unit) 11. The CPU 11 is connected, via a bus, to a ROM (Read Only Memory) 12 for storing information such as a program, a RAM (Random Access Memory) 13 for storing temporarily generated information, an A/D converter 14 for converting an analog voltage into a digital value, an interrupt controller 15 for mediating between a plurality of interrupt requests, and a generating portion 16 for generating two PWM signals. A portion of the signal generation circuit 1 excluding the generating portion 16 is a control portion 10, but the generating portion 16 may also be included in the control portion 10.

The interrupt controller 15 is configured to be able to accept a plurality of interrupt requests. If the interrupt controller 15 has received an interrupt request, the interrupt controller 15 gives a signal requesting an interrupt (so-called INT signal) to the CPU 11. When an acknowledge signal (so-called INTA signal) is given from the CPU 11, the interrupt controller 15 sends an interrupt vector that corresponds to the interrupt request to the bus. If the interrupt vector sent to the bus is read by the CPU 11, the CPU 11 executes interrupt processing that corresponds to the interrupt request.

The voltage conversion circuit 2 includes an N-channel MOSFET (Metal Oxide Semiconductor Field Effect Transistor: hereinafter, simply "FET") 21, whose drain is connected to a positive terminal of the battery 3, an FET 22 for synchronous rectification whose drain and source are connected respectively to a source of the FET 21 and a negative terminal of the battery 3, and a driving circuit 26 for giving a driving signal to gates of the FET 21 and the FET 22 based on PWM signals given from the generating portion 16. In the following description, the FETs 21 and 22 will also be called a high-side FET and a low-side FET, respectively.

The load 4 is connected between the drain and source of the FET 22 via a series circuit that includes an inductor 23 and a resistor 24. A capacitor 25 is connected in parallel to the load 4. A voltage at a node between the resistor 24 and the capacitor 25 is given to the A/D converter 14. A current detector 27 is connected to both terminals of the resistor 24, and a voltage detected by the current detector 27 is given to the A/D converter 14.

Now referring to FIG. 2, the ROM 12 contains a set value storage table (which corresponds to a storing portion) 121 for storing a plurality of set values that are determined in advance in association with later-described target values. However, in Embodiment 1, the set value storage table 121 is not used.

The RAM 13 contains a set value storage area 131, in which a plurality of set values that are to be set for a register buffer 161, which is included in the generating portion 16, are stored. The set values stored in the set value storage area 131 are sequentially set for the register buffer 161 through later-described interrupt processing, which is mediated by the interrupt controller 15.

The generating portion 16 includes register buffers 161 and 162, for which respective set values of on-time and set values of off-time, which will be described later, are set, an on-time register 163 and an off-time register 164, in which respective contents of the register buffers 161 and 162 are periodically loaded, a first signal generating portion 165 for generating a first signal having an on-time that corresponds to the content of the on-time register 163, and a second signal generating portion 166 for generating a second signal having off-time that corresponds to the content of the off-time register 164. In the following description, a period in which a state where a signal is ON continues for the on-time will be called an on-period.

The generating portion 16 also includes a period register (not shown) for setting a period that is common to the first signal and the second signal, and a dead time register (not shown) for setting a dead time that is set prior to the on-period of the first signal in an off-time that is common to the first signal and the second signal (so-called dead time). A predetermined value is individually set for the period register and the dead time register at the time of initialization by the CPU 11.

The first signal generating portion 165 and the second signal generating portion 166 give load signals for loading the contents of the register buffers 161 and 162 into the on-time register 163 and the off-time register 164, respectively. The first signal and the second signal that are generated respectively by the first signal generating portion 165 and the second signal generating portion 166 are complementary PWM signals having on-periods that do not overlap each other and that have on-time and off-time that are integral multiples of an internal clock (not shown). The PWM signal generated by the first signal generating portion 165 is given to the FET (high-side FET) 21 via the driving circuit 26, and is also given as an interrupt request to the interrupt controller 15. The PWM signal generated by the second signal generating portion 166 is given to the FET 22 (low-side FET) via the driving circuit 26.

In the above configuration, the CPU 11 in the signal generation circuit 1 controls the voltage supplied to the load 4 using a current mode control method, in which voltage loop control and current loop control are executed in parallel, for example. In the voltage loop control, the CPU 11 computes an amount of operation that is to serve as a target current value in the current loop control at a later stage, based on a deviation that is obtained by subtracting a digital value, which is obtained due to the A/D converter 14 converting the output voltage supplied to the load 4, from the target voltage value. In this voltage loop control, the voltage output by the voltage conversion circuit 2 is the amount of control.

In the current loop control, the CPU 11 computes an amount of operation to be made to the generating portion 16, based on a deviation that is obtained by subtracting a digital value, which is obtained due to the A/D converter 14 converting the voltage detected by the current detector 27, from the target current value obtained through the voltage loop control at the previous stage. The CPU 11 determines a settable value of the on-time that can be set for the first signal generating portion 165 in the generating portion 16, in accordance with the computed amount of operation (hereinafter, "target value"). The CPU 11 also calculates a settable value of the off-time that can be set for the second signal generating portion 166, based on the aforementioned settable value of the on-time and the value that is set for the aforementioned dead time register. The details will be described later.

The aforementioned settable value refers to an integral multiple value of a minimum unit (minimum increment) that is reflected in a change in an output PWM signal when set for the generating portion 16. The first signal generating portion 165 and the second signal generating portion 166 have the same minimum unit of settable values. The on-time and the off-time that are set by the settable values have the same accuracy. In the following description, for the sake of simplification, a settable value that is determined or calculated in order to be set for the generating portion 16 will be simply called a set value. As a result of the determined set value of the on-time and the calculated set value of the off-time being set for the generating portion 16, the generating portion 16 generates the first signal having an on-time that corresponds to the determined set value, and the second signal having an off-time that corresponds to the calculated set value. In this current loop control, the current output by the voltage conversion circuit 2 is the amount of control.

Here, in the case where the output voltage and output current of the voltage conversion device temporally vary in a relatively moderate manner, it can be considered to be sufficient if the control periods of the aforementioned voltage loop control and current loop control are periods each of which is N times (N is a natural number that is 2 or greater) of the PWM period. In Embodiment 1, set values of the on-time for N periods for the generating portion 16 are collectively determined in every N PWM periods and are stored in the set value storage area 131, and the set values of the on-time are set for the generating portion 16 through interrupt processing that is generated in the PWM periods.

In the following description, it is assumed that N=4, for the sake of simplification. However, the invention is not limited thereto, and N may also be 2, 3, or 5 or greater. The set values for N periods do not need to be necessarily set for the generating portion 16 for every period, and may also be set only when the set value of the on-time of the first signal differs between a period and the next period.

Next, a description will be given of a mechanism by which the first signal generating portion 165 generates the first signal having the on-time that corresponds to the content of the register buffer 161. A mechanism by which the second signal generating portion 166 generates the second signal having the off-time that corresponds to the content of the register buffer 162 is the same as the following case in FIG. 3, replacing the on-time with the off-time. Accordingly, a description thereof is omitted. However, regarding the second signal, the point that the content of the register buffer 162 is set only once in N periods is different from the case of the first signal (details will be described later).

Figure 3:
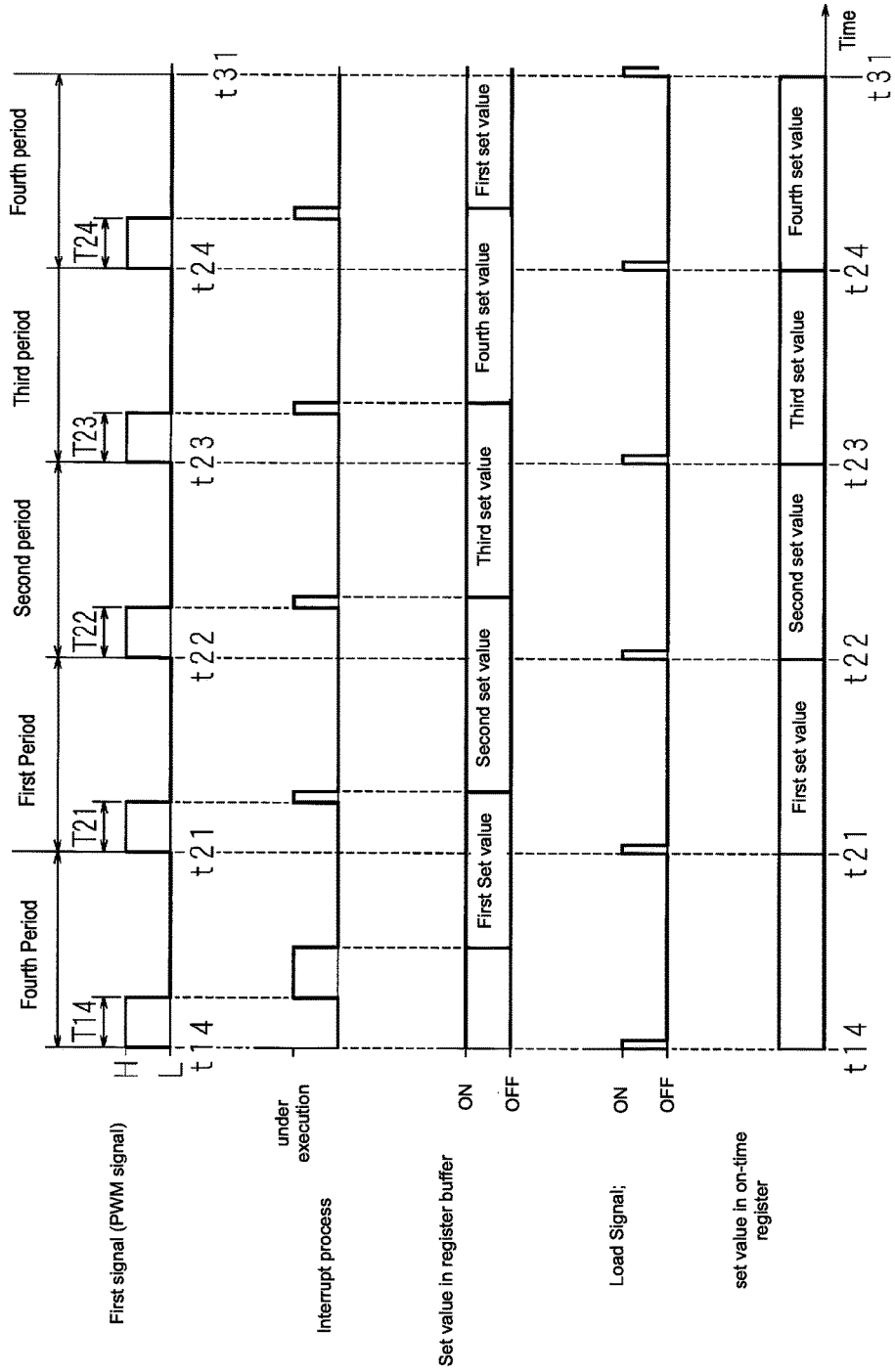
FIG. 3 shows timing charts illustrating an operation of a generating portion to generate a first signal.

FIG. 3 shows timing charts illustrating an operation of the generating portion 16 to generate the first signal. All of the five timing charts shown in FIG. 3 have the same horizontal axis, which is the time axis. The vertical axis indicates, from the upper side of the diagram, the signal level of the first signal (PWM signal), the execution status of interrupt processing that is executed in accordance with the PWM signal, the content of the register buffer 161 in the generating portion 16, the on/off status of the load signal for loading the content of the register buffer 161 into the on-time register 163, and the content of the on-time register 163.

Regarding the PWM signal, a period from time t21 to t22, a period from time t22 to t23, a period from time t23 to t 24, and a period from time t24 to t31 respectively are a first period, a second period, a third period, and a fourth period of N periods (N=4), and a period from time t14 to t21 is a fourth period of the previous N periods. The timing at which the PWM signal rises coincides with the time point when each period starts. However, for the sake of simplification, the aforementioned dead time is not shown in FIG. 3. A fall of the PWM signal in each period when the signal level thereof changes from high to low is accepted as an interrupt request that is made to the interrupt controller 15, and interrupt processing is executed once.

Specifically, interrupt processing is executed when the on-time T14, T21, T22, T23, and T24 has elapsed respectively from the time t14, t21, t22, t23, and t24 in the respective periods. In the interrupt processing in these periods, the interrupt processing in the fourth period is executed for a longer time period than the interrupt processing in the first period, second period, and third period, the execution time being longer by the time to collectively determine the set values for the next N periods. The determined set values are stored as a first set value, second set value, third set value, and fourth set value in successive storage areas from a first address to a fourth address in the set value storage area 131 that is contained in the RAM 13.

The first set value, second set value, third set value, and fourth set value that are stored in the set value storage area 131 are sequentially read out through the interrupt processing in the fourth period in which these set values are stored, and the interrupt processing in the first period, second period, and third period of the next N periods, respectively, and are set for the register buffer 161. Thus, in the interrupt processing in the first period, second period, third period, and fourth period, the content in the register buffer 161 is replaced with the second set value, the third set value, the fourth set value, and the first set value that is for the next N period, respectively.

On the other hand, at rises of the PWM signal when the signal level thereof changes from low to high, that is, at the time t14, t21, t22, t23, t24, and t31, the load signal for loading the content of the register buffer 161 is given from the first signal generating portion 165 to the on-time register 163. As a result, during the first period, second period, third period, and fourth period, the content of the on-time register 163 is held at the set values for the first period, second period, third period, and fourth period, respectively. With these set values, the respective on-time of the PWM signal in the first period, second period, third period, and fourth period is determined.

Note that, in the example shown in FIG. 3, four set values for the next N periods are determined during the fourth period in the previous N periods. However, in the case where this determination is not completed within the fourth period, the set value storage area 131 may use a double buffering technique to avoid contention between the writing to the set value storage area 131 and the reading therefrom. Specifically, a configuration may be employed in which four set values are determined during a fourth period, first period, second period, and third period that are successive, and written to one of the set value storage areas, then the next four set values are determined and written to the other one of the set value storage areas, and the previously-determined four set values are sequentially read out from the one of the set value storage areas through the interrupt processing in the respective periods, during the following fourth period, first period, second period, and third period.

Next, a description will be given of a specific example of setting, for the generating portion 16, a set value of the on-time corresponding to a target value.

Figure 4:
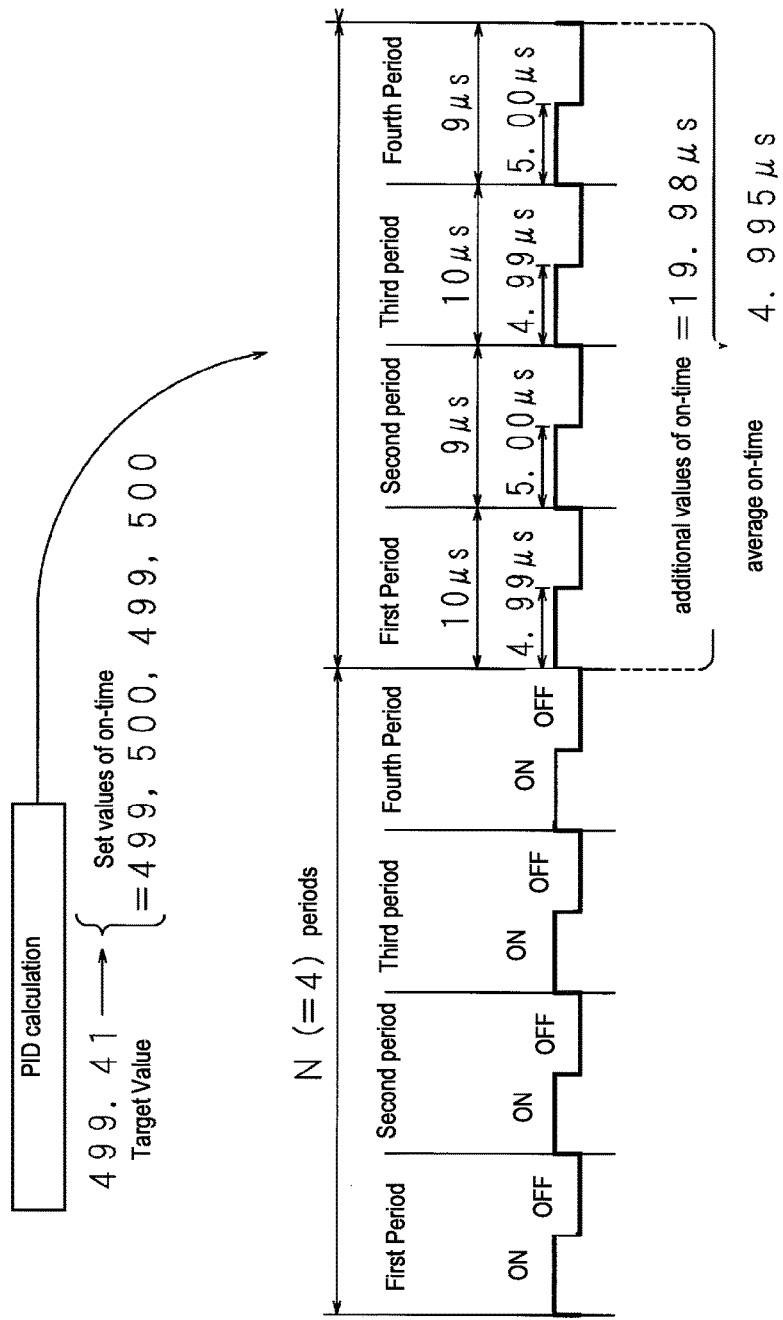
FIG. 4 shows timing charts illustrating an operation in which average on-time of a PWM signal is determined by set values for N periods.

FIG. 4 shows timing charts illustrating an operation in which average on-time of the PWM signal is determined by the set values for the N periods. The horizontal axis in FIG. 4 indicates time, and the vertical axis indicates the signal level of the first signal (PWM signal). FIG. 4 shows a state where, in two successive sets of N periods, the PWM signal turns on and off in the first period, second period, third period, and fourth period of the PWM periods. The PWM signal is ON in the first half of the respective PWM periods, and is OFF in the latter half. Here again, it is assumed that N=4 for the sake of simplification.

In Embodiment 1, the period of the PWM signal generated by the generating portion 16 is 10 μs, the minimum unit (i.e. minimum increment) of the set value of the on-time that can be set for the generating portion 16 is 1, and this minimum unit of 1 corresponds to 0.01 μs of the on-time of the PWM signal. In other words, the on-time of the first signal generated by the generating portion 16 can be set with an accuracy of 0.01 μs. On the other hand, it is assumed that the minimum unit of the target value calculated through PID calculation by the CPU 11 is 0.01. An example of the timing at which the computation is performed and the timing at which the set values are set for the generating portion 16 is shown in FIG. 3.

A case is considered in which, in the timing shown in FIG. 4, the target value is 499.41, for example, as a result of PID calculation in the previous N periods. When the set value of the on-time of the PWM signal is set to 499 with respect to this target value, the on-time of the PWM signal is 4.99 μs. When the set value of the on-time of the PWM signal is set to 500, the on-time of the PWM signal is 5.00 μs. Thus, in the case of varying the set value of the on-time by 1 at a time, the on-time of the PWM signal varies by 0.01 μs unit, and an error (here, 0.004 μs or 0.006 μs) from 4.9940 μs, which is the target on-time corresponding to the target value, is large.

In Embodiment 1, a set value of the on-time with which an on-time that is close to the target on-time corresponding to the target value is determined. Here, it is favorable to determine a set value of the on-time with which the on-time that is closest to the target on-time can be obtained. Specifically, since the target on-time corresponding to the target value (499.41) is 4.9941 μs, the aforementioned first set value, second set value, third set value, and fourth set value are determined respectively as 499, 500, 499, and 500, for example.

In this case, the on-time of the PWM signal that is generated in the next N periods due to the respective set values is 4.99 μs, 5.00 μs, 4.99 μs, and 5.00 μs, the additional value of the on-time is 19.98 μs, and therefore, the average on-time is 4.995 μs. Accordingly, the error from 4.9941 μs, namely the target on-time can be kept to 0.0009 μs. In the case where N=4 as in Embodiment 1, the average on-time can be set with an accuracy of 0.0025 μs.

Next, a description will be given of a method to determine the off-time of the second signal based on the on-time of the first signal.

Figure 5:
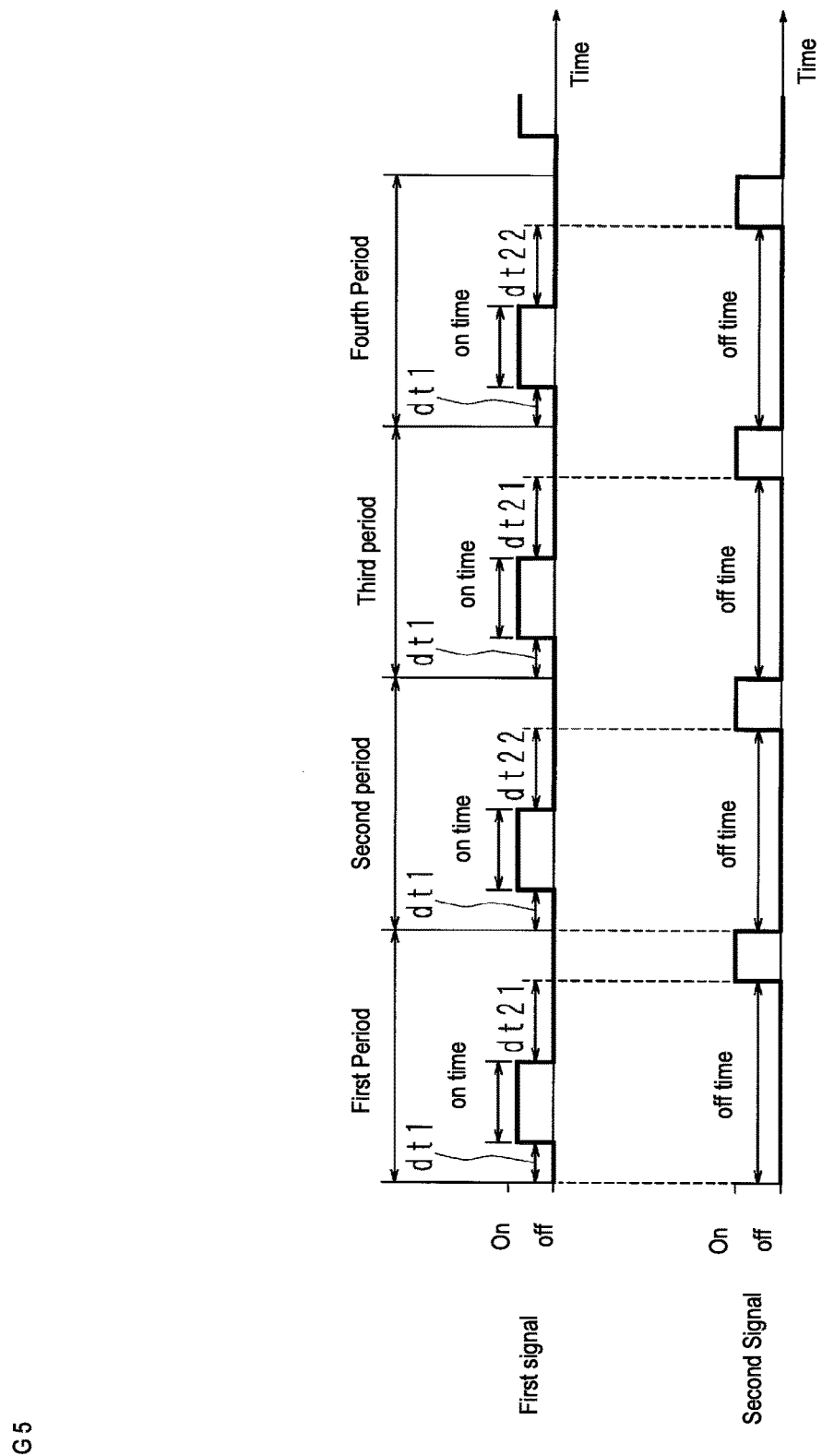
FIG. 5 shows timing charts illustrating a relationship between on-time of the first signal, off-time of a second signal, and dead time.

FIG. 5 shows timing charts illustrating a relationship between the on-time of the first signal, the off-time of the second signal, and the dead time. Both of the two timing charts shown in FIG. 5 have the same horizontal axis, which is the time axis. The vertical axis indicates the signal level of the first signal and the second signal as time elapses from the first period to the fourth period.

As mentioned above, the minimum unit of the set values of the on-time of the first signal and the off-time of the second signal is 1. It is assumed here that the minimum unit of the set value to be set for the dead time register to set a dead time dt1, which is prior to the on-period of the first signal, is also 1. The on-time and the off-time that are set for the first signal and the second signal have the same accuracy. It is assumed that the accuracy of the dead time dt1 is also the same as the accuracy of the on-time and the off-time.

FIG. 5 shows an example in which, regarding the first signal, the on-time in the second period and the fourth period is longer than the on-time in the first period and the third period. Meanwhile, as described using FIG. 4, a variation in the set value of the on-time of the first signal during N periods is 1 to the maximum. Accordingly, it can be considered that the on-time in the second period and the fourth period of the first signal is longer than the on-time in the first period and the third period by the amount that corresponds to the accuracy of the on-time.

It is assumed here that the dead time that follows the on-period of the first signal in the first period to the fourth period is dt21, dt22, dt21, and dt22, respectively. Ordinarily, the length of the dead time dt1 may be fixed, and the length of the dead time dt21 and dt22 needs to be equal to or longer than the length of the dead time dt1. If the length of the dead time dt21 and dt22 are set to be equal, the off-time of the second signal will vary during the N periods in accordance with a variation in the on-time of the first signal, as is clear from FIG. 5, and the load on the CPU 11 to calculate the set values of the off-time of the second signal will increase.

For this reason, in Embodiment 1, the length of the dead time dt22 is set to a minimum necessary length (specifically, for example, the same length as the dead time dt1), and the length of the dead time 21 is allowed to be longer than the length of the dead time dt22 by the amount that corresponds to the accuracy of the dead time. Meanwhile, the on-time of the first signal varies during the N periods by the same amount as the accuracy of the dead time. Accordingly, by calculating the set values of the off-time of the second signal using Expression (1) below, the dead time that follows the on-period of the first signal is automatically fixed to either the dead time dt21 or the dead time dt22.

Set value of off-time of second signal=(smaller one of set values of on-time of first signal during $N$ periods)+(value for setting off-period of second signal to be the same length as dead time dt1)+ (value for setting off-period of second signal to be the same length as dead time dt22)+1   (1)

Next, a description will be given of a method to determine a first set value, a second set value, a third set value, and a fourth set value that correspond to the target value.

Figure 6:
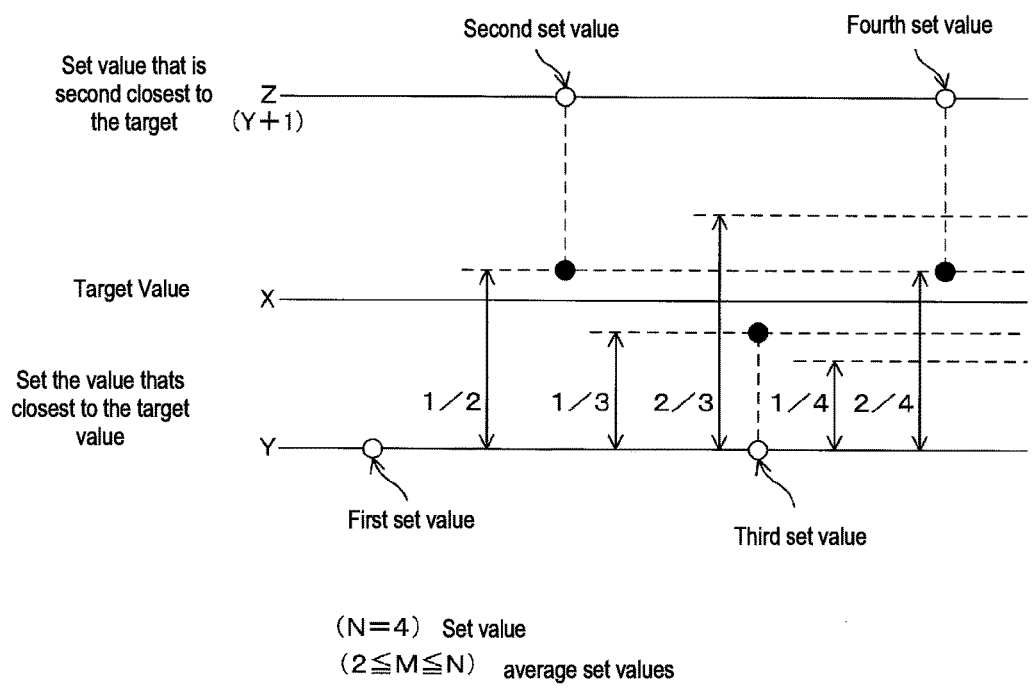
FIG. 6 is a diagram illustrating a method to determine N set values in the signal generation circuit according to Embodiment 1 of the present invention.

FIG. 6 is a diagram illustrating a method to determine N set values in the signal generation circuit 1 according to Embodiment 1 of the present invention. In FIG. 6, "○" represents N (N=4) set values, and "●" represents an average value of M (2≤M≤N) set values. Since the average value is meaningless for the first set value, the number of "●" is smaller than the number of "○" by one.

First, a set value Y that is closest to a target value X, and a set value Z that is second closest thereto are specified. In the example in FIG. 6, Y, which is smaller than X but is not smaller than X by ½ or more, is specified first, and Z is specified as Y+1. In the case where, unlike the case shown in FIG. 6, Y that is greater than X but is not greater than X by ½ or more is first specified (not shown), Z is specified as Y−1.

In Embodiment 1, N set values are sequentially determined from Y and Z (=Y+1). At this time, an $M^{th}$ set value is sequentially determined so that the average value of the first set value to the $M^{th}$ (2≤M≤N) set value is a value that is closest to the target value X. The first set value is determined prior to the second set value, anticipating that the average value of the first and second set values will be closest to the target value X. For this reason, the first set value is always determined as Y. A candidate value of the second set value is Y or Z.

When the second set value is determined, it is determined which of the average values of the first set value and the two respective candidate values of the second set value is closer to X. In this case, the first set value is Y and the two candidate values are Y and Z. Accordingly, Y, which is the average value of Y and Y, is compared with Y+½, which is the average value of Y and Z (=Y+1), to determine which is closer to X. In the case of FIG. 6, Y+½ is closer to X than Y, and accordingly the second set value is determined as Z.

When the third set value is determined, it is determined which of the average values of the first set value, the second set value, and two respective candidate values of the third set value is closer to X. In this case, the first set value is Y, the second set value is Z (=Y+1), and the two candidate values of the third set values are Y and Z (=Y+1). Accordingly, it is determined which of Y+⅓, which is the average value of Y, Y+1, and Y, and Y+⅔, which is the average value of Y, Y+1, and Y+1, is closer to X. In the case of FIG. 6, Y+⅓ is closer to X than Y+⅔, and accordingly the third set value is determined as Y.

When the fourth set value is determined, it is determined which of the average values of the first set value, the second set value, the third set value, and two respective candidate values of the fourth set value is closer to X. In this case, the first set value is Y, the second set value is Z (=Y+1), the third set value is Y, and the two candidate values of the fourth set values are Y and Z (=Y+1). Accordingly, it is determined which of Y+¼, which is the average value of Y, Y+1, Y, and Y, and Y+¾, which is the average value of Y, Y+1, Y, and Y+1, is closer to X. In the case of FIG. 6, Y+¾ is closer to X than Y+¼, and accordingly the third set value is determined as Z.

Although FIGS. 3 to 6 illustrate the case where N is 4, the same applies to cases where N is 2, 3, or 5 or greater. A description will be described below of operations of the signal generation circuit 1 to determine the aforementioned N set values, using a flowchart that illustrates these operations. Processing that will be described below is executed by the CPU 11 in accordance with a control program that is stored, in advance, in the ROM 12.

Figure 7:
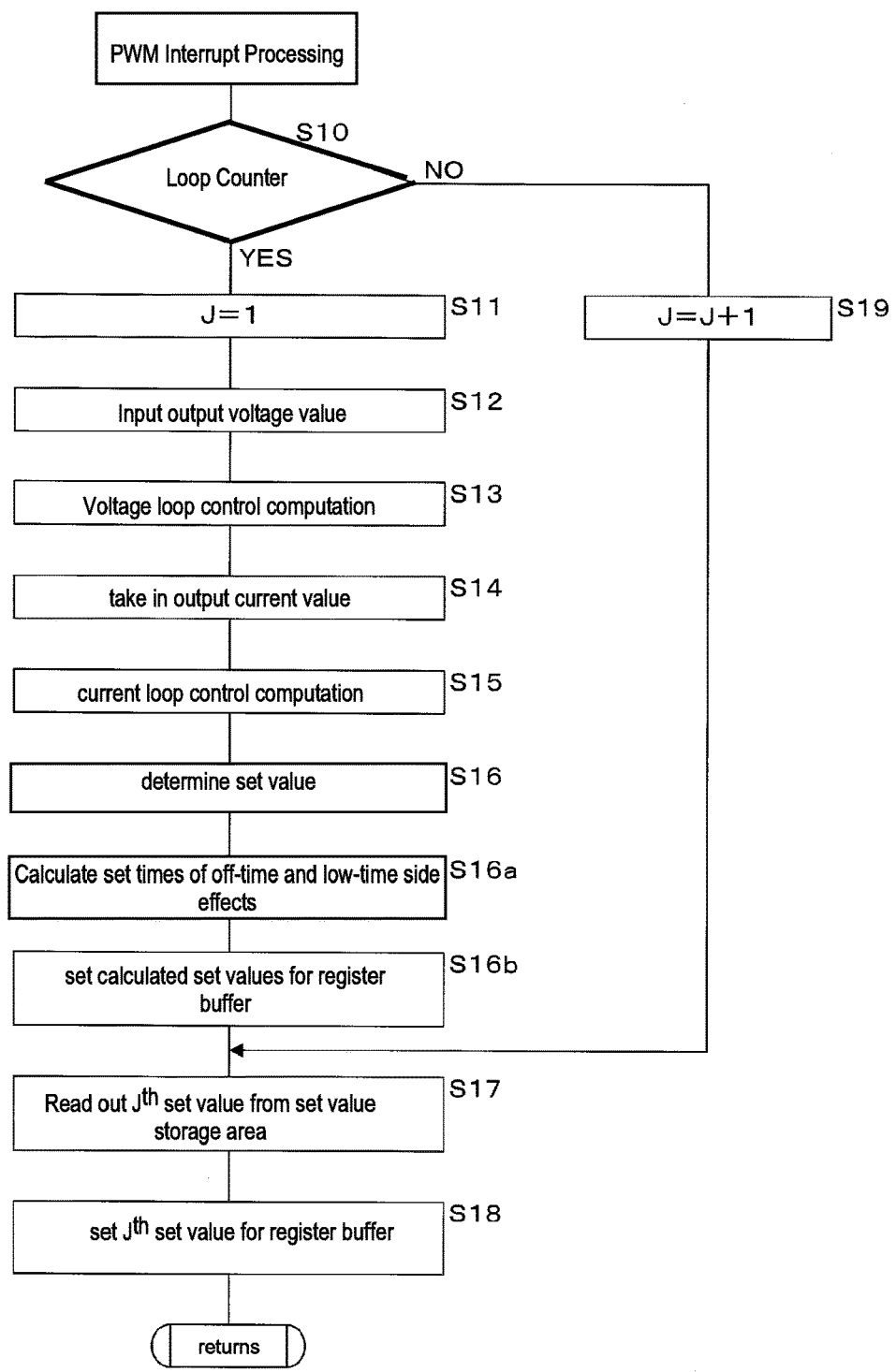
FIG. 7 is a flowchart showing a processing procedure of a CPU that executes PWM interrupt processing in the signal generation circuit according to Embodiment 1 of the present invention.
Figure 8:
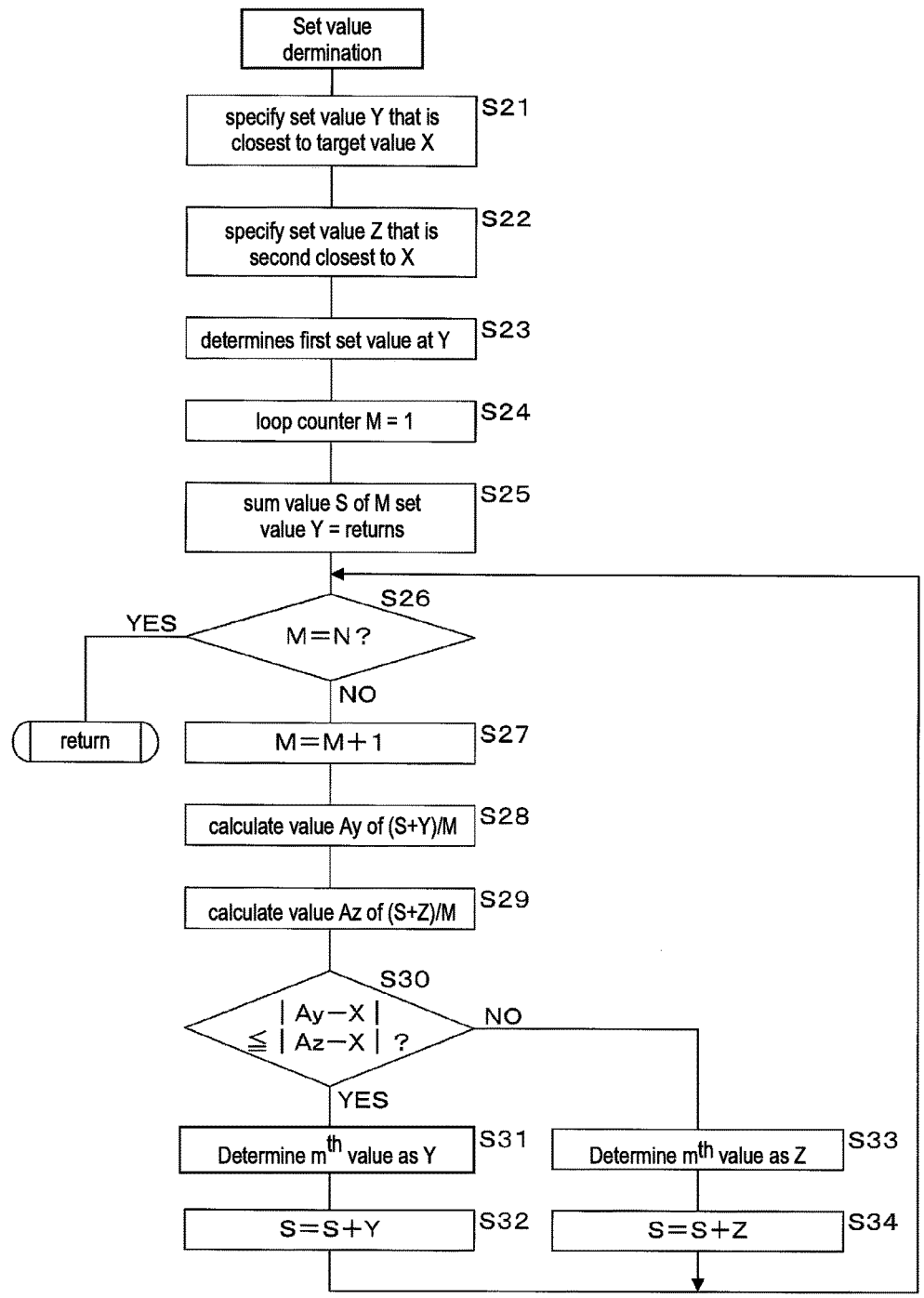
FIG. 8 is a flowchart showing a processing procedure of the CPU related to a subroutine to determine a set value according to Embodiment 1 of the present invention.

FIG. 7 is a flowchart showing a processing procedure of the CPU 11 that executes PWM interrupt processing in the signal generation circuit 1 according to Embodiment 1 of the present invention. FIG. 8 is a flowchart showing a processing procedure of the CPU 11 related to a subroutine to determine a set value according to Embodiment 1 of the present invention.

A loop counter J in FIG. 7, the target value X, the value Y closest to the target value, the second closest value Z, a loop counter M, a sum value S of M set values, a value Ay, and a value Az in FIG. 8 are stored in the RAM 13. The initial value of the loop counter J is N. It is favorable that N set values that are determined through processing in FIG. 8 are sequentially stored in successive addresses in the set value storage area 131.

If an interrupt of a PWM period has occurred and the control performed by the CPU 11 has transferred to the processing in FIG. 7, the CPU 11 determines whether or not the loop counter J is N (here, 4) (S10). If J is N (S10: YES), J is set to 1 (S11). Thereafter, the CPU 11 takes in an output voltage value that has been obtained due to the A/D converter 14 converting the output voltage supplied to the load 4 (S12: this step corresponds to a detecting portion), executes computation associated with the voltage loop control based on the taken output voltage value (S13), and calculates a target current value as an amount of operation.

Thereafter, the CPU 11 takes in an output current value that has been obtained due to the A/D converter 14 converting the voltage detected by the current detector 27 (S14), executes computation associated with the current loop control based on the taken output current value (S15), calculates the target value X to be set as an amount of operation for the signal generating portion 16 (this step corresponds a calculating portion), and stores the calculated target value X in the RAM 13. To omit the current loop control, steps S14 and S15 may not be executed.

Next, the CPU 11 invokes and executes a subroutine associated with set value determination (S16). If the processing has returned from the subroutine associated with set value determination, the CPU 11 calculates a set value of the off-time of the FET 22 (low-side FET) using Expression (1) (S16a), and sets the calculated set value for the register buffer 161 (S16b: this step corresponds to a setting portion). Thereafter, the CPU 11 reads out a $J^{th}$ set value in the N set values from the set value storage area 131 (S17), sets the read $J^{th}$ set value for the register buffer 161 (S18), and returns to the interrupted routine.

On the other hand, if J is not N in step S10 (S10: NO), the CPU 11 increments J by 1 (S19), and then advances the processing to step S17 to set the $J^{th}$ set value for the register buffer 161.

Now referring to FIG. 8, if the subroutine associated with set value determination is invoked from the PWM interrupt processing, the CPU 11 specifies the set value Y that is closest to the target value X stored in the RAM 13 (S21: this step corresponds to a specifying portion), also specifies the second closest set value Z (S22: this step also corresponds the specifying portion), and determines the first set value as Y (S23: this step corresponds to a determining portion). At this point, Z is specified as either Y+1 or Y−1. Next, the CPU 11 set the loop counter M to 1 (S24), and sets the sum value S of the M set values to Y (S25).

Thereafter, the CPU 11 determines whether or not M is N (S26). If M is N (S26: YES), the CPU 11 returns to the invoked routine. If M is not N (S26: NO), the CPU 11 increments M by 1 (S27), then calculates the value Ay of (S+Y)/M (S28), and also calculates the value Az of (S+Z)/M (S29). Ay and Az calculated here are two candidate values that can be the average value of the M set values.

Next, the CPU 11 determines whether or not |Ay−X| is smaller than or equal to |Az−X| (S30). This determination is for determining which of the two candidate values is closer to the target value X. If |Ay−X| is smaller than or equal to |Az−X| (S30: YES), the CPU 11 determines the $M^{th}$ set value as Y (S31: this step corresponds to the determining portion), replaces the sum value S of the M set values with S+Y (S32), and thereafter advances the processing to step S26. On the other hand, if |Ay−X| is greater than |Az−X| (S30: NO), the CPU 11 determines the $M^{th}$ set value as Z (S33: this step corresponds to the determining portion), replaces the sum value S of the M set values with S+Z (S34), and thereafter advances the processing to step S26.

In the above flowcharts, the set value Y that is closest to the target value X and the second closest set value Z are first specified, and the value of Z (Y+1 or Y−1) is stored in the RAM 13. However, the invention is not limited to this method. For example, a configuration may also be employed in which, when the $M^{th}$ set value is determined, an average value of the first set value to the M−1$^{th}$ set value is calculated in advance, the set value Y that is closest to the target value X is specified on every occasion by determining a relationship regarding which of this average value and the target value X is larger or smaller, and it is also specified whether the second closest set value Z is Y+1 or Y−1.

Next, a description will be given of a plurality of examples of the N set values that are determined as described above.

FIG. 9 is a table showing a list of N set values that are determined in accordance with target values in the signal generation circuit 1 according to Embodiment 1 of the present invention. It is assumed that the target values are expressed as a numeric value with two decimal places. In the following description, representative target value ranges will be described while listing the N set values. For example, if the target value is in a range from 0.13 to 0.16, the first, second, third, and fourth set values are determined as 0, 0, 0, and 1, respectively. In this case, the average value of the N set values is 0.25, and the average value of the on-time of the PWM signal based thereon is 0.0025 µs.

If the target value is in a range from 0.38 to 0.50, the first, second, third, and fourth set values are determined as 0, 1, 0, and 1, respectively. The average value of the N set values is 0.50, and the average value of the on-time of the PWM signal based thereon is 0.005 µs. If the target value is in a range from 0.51 to 0.62, the first, second, third, and fourth set values are determined as 1, 0, 1, and 0, respectively. The average value of the N set values is 0.50, and the average value of the on-time of the PWM signal based thereon is 0.005 µs. If the target value is in a range from 0.88 to 1.12, the first, second, third, and fourth set values are determined as 1, 1, 1, and 1, respectively. The average value of the N set values is 1.00, and the average value of the on-time of PWM signal based thereon is 0.010 µs.

For nine respective ranges of the target value within a range from 0.13 to 1.12, the N set values are determined so as to increase by 1 every time the lower limit and upper limit of the target value range increase by 1.00. Particularly, regarding the case that corresponds to FIG. 4, if the target value is in a range from 499.38 to 499.50, the first, second, third, and fourth set values are determined as 499, 500, 499, and 500, respectively. The average value of the N set values is 499.50, and the average value of the on-time of the PWM signal based thereon is 4.995 µs.

As described above, according to Embodiment 1, the CPU 11, which functions as a core of the control portion 10, determines and sets a set value that can be set for the register buffer 161 in the generating portion 16 in accordance with the target value X that is to be set for the generating portion 16. The generating portion 16 periodically generates the first signal having an on-time that corresponds to the set value that is set for the register buffer 161, and the second signal that has a dead time with respect to the first signal. Specifically, the CPU 11 specifies the set value Y that is closest to the target value X and the second closest set value Z in every N(=4) periods of the first signal that is generated by the first signal generating portion 165 provided in the generating portion 16, determines N set values by combining Y and Z based on the result of comparison between the values of the specified Y and Z and the value of X, and sets one set value for the register buffer 161 in the generating portion 16 for each period of the first signal. The CPU 11 also calculates the value for setting the off-time of the second signal in the first period in the N periods as an additional value obtained by adding the smaller one of the settable values determined for the same N periods to a predetermined value, and sets the calculated value for the register buffer 162 in the generating portion 16.

Thus, the proportion between the set value Y that is closest to the target value X and the second closest set value Z is appropriately determined for the N set values determined by the CPU 11. As a result, the average value of the N set values is adjusted more finely than the smallest increment of the value that can be set for the register buffer 161 in the generating portion 16. Furthermore, since the off-time of the second signal need only be set once in the N periods, the processing load on the CPU 11 is reduced.

Accordingly, the minimum increment of the value to be set for the generating portion 16, which periodically generates the first signal having an on-time that corresponds to the set value and the second signal having an on-period that does not overlap the on-period of the first signal, can be made substantially smaller than the actual increment, with a relatively small processing load.

Furthermore, according to Embodiment 1, the aforementioned predetermined value is a value that is greater, by the minimum unit of the settable value of the on-time of the first signal, than the value for setting the off-time of the second signal to have the same length as the dead time in which both the first and second signals are to be OFF.

Thus, even if the on-time of the first signal has varied during the N periods, the dead time for the first signal and the second signal can be secured.

Furthermore, according to Embodiment 1, the CPU 11 determines the set value Y that is closest to the target value X as the first set value, and repeats determining the $M^{th}$ set value N−1 times so that the average value of the first set value to the $M^{th}$ set value (2≤M≤N) is closest to the target value X.

Accordingly, in any of the period in the N periods of the PWM signal, the average value of the set values that have been set for the generating portion 16 in the first period to that period can be set to a value that is closest to the target value X.

Embodiment 2

In Embodiment 1, the first set value and the $M^{th}$ set value (2≤M≤N) are determined sequentially. In contrast, in Embodiment 2, N set values are collectively determined by calculating the number of set values that are second closest to the target value among M set values.

Since the configuration of the voltage conversion device according to Embodiment 2 is the same as that shown in FIGS. 1 and 2 in Embodiment 1, the same reference numerals are assigned to parts that correspond to Embodiment 1, and their further description is omitted.

Figure 10:
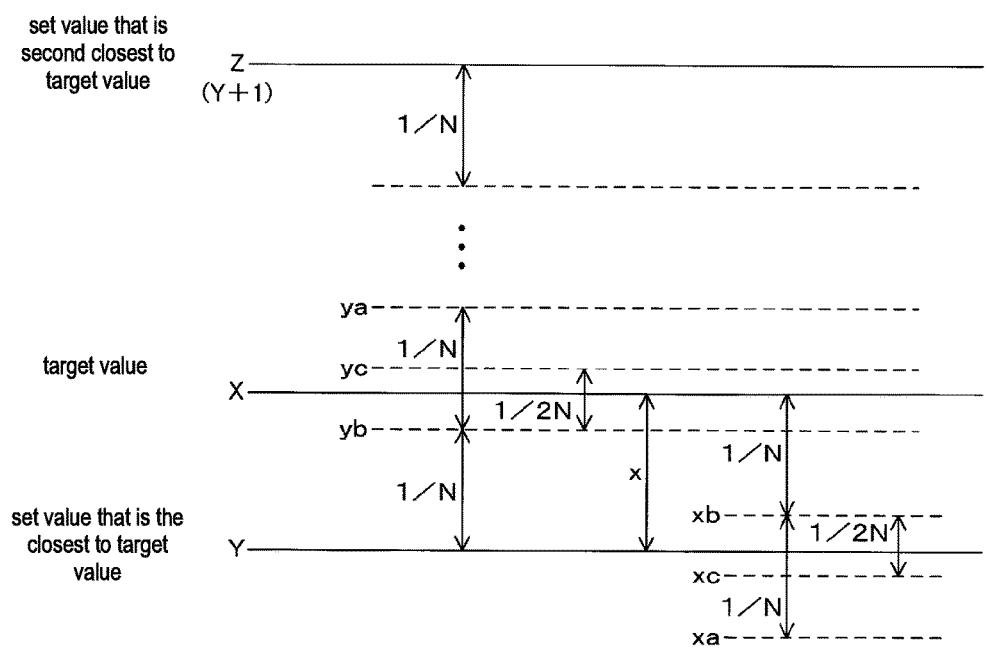
FIG. 10 is a diagram illustrating a method to determine N set values in the signal generation circuit according to Embodiment 2 of the present invention.

FIG. 10 is a diagram illustrating a method to determine N set values in the signal generation circuit 1 according to Embodiment 2 of the present invention. First, a set value Y that is closest to a target value X, and a set value Z that is second closest thereto are specified. In the example in FIG. 10, Y, which is smaller than X but is not smaller than X by ½ or more, is specified first, and Z is specified as Y+1.

If all of the first set value to the $N^{th}$ have been determined as Y, the average value of all set values is Y. Next, if only one of the N set values has been determined as not Y but Z (in the case of FIG. 10, Y+1), the average value of all set values increases (or decreases; in the case of FIG. 10, increases) by 1/N from Y. Similarly, every time the set value determined as Z increases by 1, the average value of all set values increases (or decreases; in the case of FIG. 10, increases) by 1/N.

To obtain the number of set values to be determined as Z while considering that the relationship between the number of set values that are determined as Z and the average value of all set values is as described above, the relationship regarding which is larger or smaller between X and a value obtained by incrementing (decrementing) Y by 1/N at a time toward Z, may be determined. More specifically, when the relationship regarding which is larger or smaller between X and the value obtained by incrementing (decrementing) Y by 1/N K times is reversed, it may be determined which of a value ya, which is obtained by incrementing (decrementing) Y K times, and a value yb, which is obtained by incrementing (or decrementing) Y K−1 times, is closer to X, and the number of times (K or K−1) with which a closer value has been obtained may be determined as the number of set values to be determined as Z.

Specifically, in the case of FIG. 10, the relationship regarding which is larger or smaller between X and a value yc, which is obtained by further incrementing (or decrementing), by ½N, the value yb obtained by incrementing (or decrementing) Y by 1/N K−1 times, may be determined. In the case of FIG. 10 (see left haft of FIG. 10), K=2, and it is determined that yc is greater than X. Accordingly, the value of K−1 (=1) is the number of set values to be determined as Z.

Considering the above-described algorithm from the X side (see right half of FIG. 10), decrementing x, which is a difference between X and Y, by 1/N is repeated, and the number of set values to be determined as Z may be determined based on whether or not, when the decrement result xa becomes negative after K decrements, a value xc that is obtained by further decrementing a value xb, which is obtained by decrementing x by 1/N K−1 times, by ½N is negative. In the example in FIG. 10, K=2, and xc is negative. Accordingly, the number of Z is determined as 1. If xc is positive, the number of Z is determined as 2.

Note that a configuration may also be employed in which the difference x between X and Y is first decremented by ½N, and the number of set values to be determined as Z may be determined based on the number of times that the result of the aforementioned decrement is decremented by 1/N to obtain a negative decrement result. If the result of decrement by ½N is negative, the number of Z is determined as 0, and if the result of decrement by 1/N K times is negative, the number of Z is determined as K. A later-described flowchart will be described based on this algorithm. In the example in FIG. 10, the decrement result becomes negative when the result of decrementing x by ½N is decremented by 1/N once, and so the number of Z is determined as 1.

A description will be given below of the above-described operations of the signal generation circuit 1 using a flowchart illustrating it. Processing that will be described below is executed by the CPU 11 in accordance with a control program that is stored, in advance, in the ROM 12.

Figure 11:
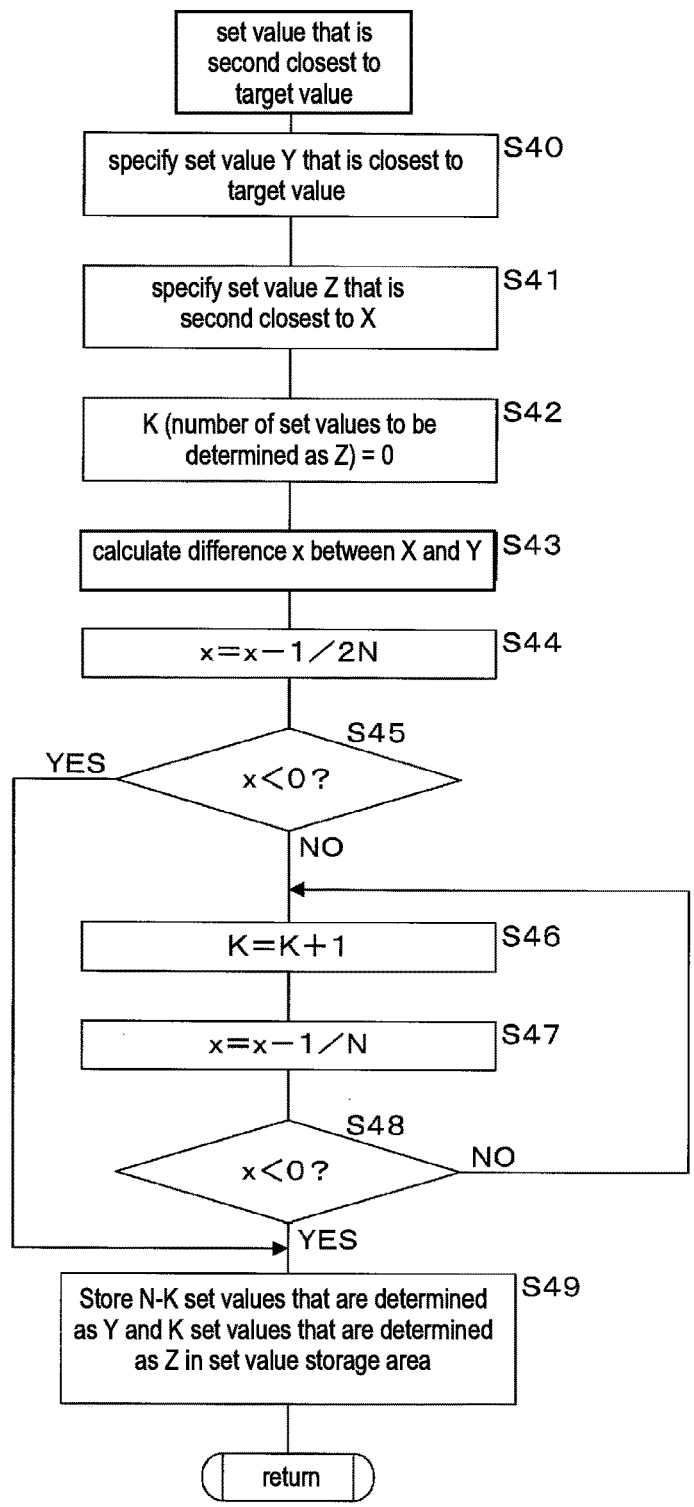
FIG. 11 is a flowchart showing a processing procedure of a CPU related to a subroutine to determine a set value according to Embodiment 2 of the present invention.

FIG. 11 is a flowchart showing a processing procedure of the CPU 11 related to a subroutine to determine a set value according to Embodiment 2 of the present invention. The number K of set values and the difference x between X and Y in FIG. 11 are stored in the RAM 13. A processing procedure of the CPU 11 associated with PWM interrupt processing is the same as that shown in FIG. 7 in Embodiment 1, and accordingly will not be shown in the diagram or described.

If the subroutine associated with set value determination is invoked from the PWM interrupt processing, the CPU 11 specifies the set value Y that is closest to the target value X stored in the RAM 13 (S40: this step corresponds to the specifying portion), also specifies the second closest set value Z (S41: this step also corresponds the specifying portion), and sets the number K of set values to be determined as Z to 0 (S42). Thereafter, the CPU 11 calculates the difference x between X and Y (S43), and sets the value obtained by decrementing the calculated x by ½N as new x (S44).

Next, the CPU 11 determines whether or not x is negative (S45). If x is negative (S45: YES), the CPU 11 advances the processing to later-described step S49. If x is not negative (S45: NO), the CPU 11 increments the value of K by 1 (S46), and sets the value obtained by decrementing x by 1/N as the new x (S47).

Next, the CPU 11 determines whether or not x is negative (S48). If x is not negative (S48: NO), the CPU 11 advances the processing to step S46. If x is negative (S48: YES), the number of Y and Z that are to be included in the N set values is determined (this step corresponds to the determining portion). The CPU 11 stores, in the set value storage area 131, N-K set values whose value is determined as Y, and K set values whose value is determined as Z (S49), and returns to the invoked routine.

Note that, although it is determined steps S45 and S48 whether or not x is negative, an equation sign may also be added to the expression for determination to determine whether or not x is smaller than or equal to 0.

Next, a description will be given of a plurality of examples of the N set values that have been determined as described above.

FIG. 12 is a table showing a list of N set values that are determined in accordance with target values in the signal generation circuit 1 according to Embodiment 2 of the present invention. In FIG. 12, N set values are arranged so that N different set values are substantially equally dispersed in this arrangement. However, the invention is not limited thereto, and the first set value, second set value, third set value, and fourth set value may also be arranged in ascending or descending order, or may also be arranged at random.

The target values and N set values shown in FIG. 12 are different from those shown in FIG. 9 in Embodiment 1 in that no sets of N set values have the same average value in the chart. This is because the algorithm to determine the N set values is different. Furthermore, in FIG. 9, the arrangement order of N set values is determined based on the algorithm. FIG. 12 is different therefrom in that the arrangement order of N set values may be determined as appropriate so as to be favorable for the PWM control for the voltage conversion circuit 2 (e.g. so that output noise is smallest).

As described above, according to Embodiment 2, the CPU 11 determines N set values so that the average value of all of the N set values is closest to the target value.

Accordingly, the average value of the N set values that are set for the generating portion 16 can be set, over the entire N periods of the signal, to a value that is closest to the target value.

Embodiment 3

In Embodiment 1, N set values are sequentially determines in every N periods. In contrast, in Embodiment 3, N set values are read out from the content that is stored in advance in the set value storage table 121 contained included in the ROM 12, in every N periods.

Since the configuration of the voltage conversion device according to Embodiment 3 is the same as that shown in FIGS. 1 and 2 in Embodiment 1, the same signs are assigned to the part that corresponds to Embodiment 1, and a description thereof is omitted. The content of the set value storage table 121 is the same as that shown in FIG. 12 in Embodiment 2.

N set values are read out in the fourth period in N periods (N=4), for example. The first set value, second set value, third set value, and fourth set value that are read out from the content stored in the set value storage table 121 are sequentially set for the register buffer 161 through interrupt processing in the fourth period in which the set values are read out, and interrupt processing in the first period, second period, and third period in the next N periods, respectively.

A description will be given below of operations of the signal generation circuit 1 to determine the aforementioned N set values, using a flowchart illustrating it. Processing that will be described below is executed by the CPU 11 in accordance with a control program that is stored, in advance, in the ROM 12.

Figure 13:
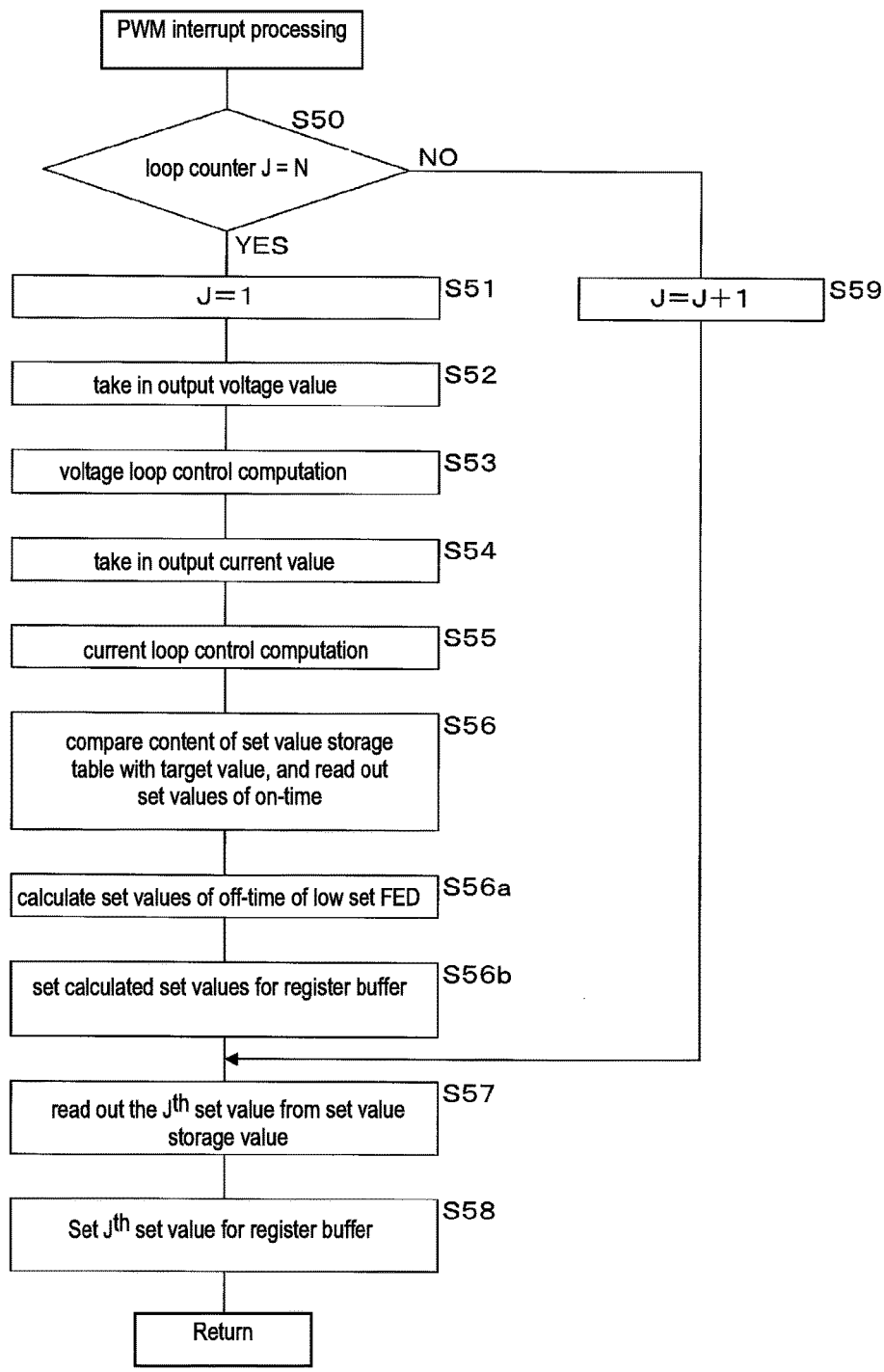
FIG. 13 is a flowchart showing a processing procedure of a CPU that executes PWM interrupt processing in the signal generation circuit according to Embodiment 3 of the present invention.

FIG. 13 is a flowchart showing a processing procedure of the CPU 11 that executes the PWM interrupt processing in the signal generation circuit 1 according to Embodiment 3 of the present invention. A loop counter J and a target value X in FIG. 13 are stored in the RAM 13. The initial value of the loop counter J is N.

Note that processing in steps S50 to S59 except for step S56 is the same as processing in steps S10 to S19 shown in FIG. 7 in Embodiment 1, and a description thereof is omitted accordingly.

If an interrupt of a PWM period has occurred and the control performed by the CPU 11 has transferred to the processing in FIG. 13, the CPU 11 determines whether or not the loop counter J is N (here, 4) (S50). If J is N (S50: YES), J is set to 1 (S51). Thereafter, the CPU 11 executes computation associated with the voltage loop control based on the output voltage and the current loop control based on the output current (S52 to S55).

Next, the CPU 11 compares the content of the set value storage table 121, that is, respective ranges of the target value stored in the table, with the target value X calculated through the aforementioned computation, and reads out set values of the on-time (S56). Specifically, as a result of the comparison, N set values stored in the set value storage table 121 are read out corresponding to the range in which the target value X is included. It is favorable that the read N set values are temporarily stored in successive addresses in the set value storage area 131 in the order in which these set values are stored in the set value storage table 121.

Next, the CPU 11 calculates the set values of the off-time of the FET 22 (low-side FET) using Expression (1) (S56a) and sets the calculated set values for the register buffer 161 (S56b: this step corresponds to the setting portion). Thereafter, the CPU 11 reads out a $J^{th}$ set value from the set value storage area 131 (S57), sets the read $J^{th}$ set value for the register buffer 161 (S58), and returns to the interrupted routine.

Note that, the head address of the N set values in the set value storage table 121 may be stored in step S56, and the $J^{th}$ set value may be read out from the set value storage table 121 in accordance with the value of the loop counter J in step S57.

As described above, according to Embodiment 3, the correspondence relationship between the range of the target value and the N set values that have been determined in advance so that the average value thereof is closest to the target value X is stored in the set value storage table 121. Through interrupt processing, the CPU 11 sequentially reads out, from the set value storage table 121, the N set values that are to be set for the register buffer 161 in the generating portion 16 in accordance with the target value X.

Accordingly, the N set values that are to be determined in accordance with the target value X can be read out from the set value storage table 121 when control is executed by the CPU 11, and can be sequentially set for the generating portion 16 over N periods.

Furthermore, according to Embodiment 1, 2, or 3, the voltage conversion circuit 2 converts a voltage by switching in accordance with the duty ratio of the first signal generated by the above-described signal generation circuit 1, and the CPU 11 in the signal generation circuit 1 calculates the target value that is to be set for the generating portion 16 through PWM control based on the converted voltage.

Accordingly, the accuracy of the output voltage can be increased by applying, to a voltage conversion device, the signal generation circuit 1, which is capable of making the minimum increment of the value that is to be set for the generating portion 16, which periodically generates the first and second signals, substantially smaller than the actual increment with a relatively small processing load.

The embodiments that are disclosed at this time are examples in all aspects, and should be considered to be not restrictive. The scope of the present invention is described not by the above-state meanings but by the claims, and is intended to include all modifications within the meanings and scope equivalent to the claims. The technical features described in the embodiments may be combined with each other.

The invention claimed is:

1. A signal generation circuit comprising:
    a generating portion for periodically generating a first signal having an on-time corresponding to a set value, and a second signal having an on-period that does not overlap an on-period of the first signal; and
    a control portion for setting a settable value that can be set for the generating portion in accordance with a target value for every period of the first signal, the generating portion generating the first and second signals for an external voltage conversion circuit, and causing a voltage to be converted by performing PWM control on the voltage conversion circuit,
    wherein the generating portion can set an off-time of the second signal with the same accuracy as the accuracy of the on-time of the first signal, and
    the control portion includes:
    a specifying portion for specifying a settable value that is closest to the target value and a second closest settable value in every N periods (where N is a natural number that is 2 or greater) of the first signal;
    a determining portion for determining N settable values that are obtained by combining two settable values specified by the specifying portion, based on values of the two settable values and the target value; and
    a setting portion for setting, for the generating portion, the off-time of the second signal in a first period in the N periods, using an additional value obtained by adding a smaller one of the settable values determined by the determining portion to a predetermined value.

2. The signal generation circuit according to claim 1, wherein the predetermined value is a value that is greater, by a minimum unit of the settable values, than a value for setting the off-time of the second signal to a time in which both the first and second signals are to be OFF.

3. The signal generation circuit according to claim 1, wherein the determining portion determines the N settable values so that an average value of M (M is a natural value that satisfies $2 \leq M \leq N$) is closest to the target value.

4. The signal generation circuit according to claim 1, wherein the determining portion determines the N settable values so that an average value of the settable values is closest to the target value.

5. The signal generation circuit according to claim 1, further comprising:
    a storing portion for storing a correspondence relationship between the target value and the N settable values,
    wherein the storing portion stores the N settable values that have been determined in advance so that an average value of the settable values is closest to a corresponding target value, and
    the controller reads out the N settable values corresponding to the target value from the storing portion, and sets the read N settable values for the generating portion.

6. A voltage conversion device comprising:
    the signal generation circuit according to claim 1;
    a voltage conversion circuit for converting a voltage by switching in accordance with a duty ratio of the first signal generated by the signal generation circuit; and
    a detecting portion for detecting the voltage that has been converted by the voltage conversion circuit,
    wherein the control portion included in the signal generation circuit includes a calculating portion for calculating the target value based on the voltage that has been detected by the detecting portion.

7. A computer program that can be executed by a control portion included in a signal generation circuit including:
    a generating portion for periodically generating a first signal having an on-time corresponding to a set value, and a second signal having an on-period that does not overlap an on-period of the first signal; and
    a control portion for setting a settable value that can be set for the generating portion in accordance with a target value for every period of the first signal, the generating portion generating the first and second signals for an external voltage conversion circuit, and causing a voltage to be converted by performing PWM control on the voltage conversion circuit,
    the computer program causing the control portion to function as:
    a specifying portion for specifying a settable value that is closest to the target value and a second closest settable value in every N periods (where N is a natural number that is 2 or greater) of the first signal;
    a determining portion for determining N settable values that are obtained by combining two settable values specified by the specifying portion, based on values of the two settable values and the target value; and a setting portion for setting, for the generating portion, the off-time of the second signal in a first period in the N periods, using an additional value obtained by adding a smaller one of the settable values determined by the determining portion to a predetermined value.

8. The signal generation circuit according to claim 2, wherein the determining portion determines the N settable values so that an average value of M (M is a natural value that satisfies $2 \leq M \leq N$) is closest to the target value.

9. The signal generation circuit according to claim 2, wherein the determining portion determines the N settable values so that an average value of the settable values is closest to the target value.

10. The signal generation circuit according to claim 2, further comprising:
a storing portion for storing a correspondence relationship between the target value and the N settable values,
wherein the storing portion stores the N settable values that have been determined in advance so that an average value of the settable values is closest to a corresponding target value, and
the controller reads out the N settable values corresponding to the target value from the storing portion, and sets the read N settable values for the generating portion.

* * * * *